United States Patent
Kashima

[19]

[11] Patent Number: 6,083,813
[45] Date of Patent: Jul. 4, 2000

[54] METHOD FOR FORMING A COMPOUND SEMICONDUCTOR DEVICE USING A BUFFER LAYER OVER A CORRUGATED SURFACE

[75] Inventor: Yasumasa Kashima, Tokyo, Japan

[73] Assignee: Oki Electric Industry Co., Ltd., Tokyo, Japan

[21] Appl. No.: 09/061,044

[22] Filed: Apr. 16, 1998

[30] Foreign Application Priority Data

Apr. 23, 1997 [JP] Japan .................................. 9-120207

[51] Int. Cl.[7] ............................ H01L 21/20; H01L 21/00
[52] U.S. Cl. .............................................. 438/493; 438/46
[58] Field of Search ................................ 438/22, 29, 31, 438/32, 46, 47, 493, 503, 505, 507, 508

[56] References Cited

U.S. PATENT DOCUMENTS 4,859,628  8/1989  Knight et al. .
5,585,309  12/1996  Mori et al. .

OTHER PUBLICATIONS

"A novel techinque for the preservation of gratings in InP and InGaAsP and for the simultaneous preservation of InP, InGaAs, and InGaAsP in OMCVD", R. Bhat et al., Journal of Crystal Growth 107 (1991) pp. 871–877.

*Primary Examiner*—Charles Bowers
*Assistant Examiner*—Keith Christianson
*Attorney, Agent, or Firm*—Jones Volentine, LLP

[57] ABSTRACT

The method for forming the compound semiconductor device includes the step of forming a buffer layer so as to cover the periodic corrugation on the InP substrate, wherein the buffer layer forms using a crystal growth temperature lower than the preferred crystal growth temperature. Accordingly, the method for forming the compound semiconductor device can avoid a shape change and a thickness change because of defect of the periodic corrugation. Further, the compound semiconductor device includes a buffer layer formed so as to cover the periodic corrugation on the InP substrate, wherein the buffer layer forms using a crystal growth temperature lower than the preferred crystal growth temperature. Accordingly, the compound semiconductor device can get superior characteristics of the compound semiconductor device.

8 Claims, 5 Drawing Sheets

METHOD FOR FORMING A COMPOUND SEMICONDUCTOR DEVICE USING A BUFFER LAYER OVER A CORRUGATED SURFACE

BACKGROUND OF THE INVENTION

1. Field of the Invention

The present invention generally relates to a compound semiconductor device and a method for forming the same, and more particularly, the present invention relates to a compound semiconductor device and a method for forming the same with regard to a semiconductor laser having a periodic corrugation.

This application is a counterpart of Japanese application Serial Number 120207/1997, filed Apr. 23, 1997, the subject matter of which is incorporated herein by reference.

2. Description of the Related Art

Distributed feedback (DFB) structure is an important approach toward the design of a mode selective optical cavity. The DFB approaches to create strong mode selectivity is based upon the propagation of waves in a periodic structure. We know that in periodic structures, special effects occur when the wavelength of the wave approaches the wavelength of the periodic structure. In semiconductor crystal, this leads to bandgaps and Bragg reflections. Similar effects occur for optical waves.

In the DFB structure, a periodic corrugation is incorporated into the laser structure. The fabrication process is by no means trivial and involves growing the basic laser structure, etching a periodic structure and regrowing the top layer. The corrugation should be as close as possible to an active layer so that the optical wave interacts strongly with the corrugation. However, since the placement of the corrugation creates defects, the corrugation cannot be too close to the active region. Accordingly, in the fabrication process of the DFB laser, it is very important whether or not an active layer can be formed on the corrugation without damaging the corrugation.

SUMMARY OF THE INVENTION

An object of the present invention is to provide a compound semiconductor device that can get superior characteristics of the compound semiconductor device.

According to one aspect of the present invention, for achieving the above object, there is provided a compound semiconductor device comprising a compound semiconductor base; a periodic corrugation formed on the compound semiconductor base; a compound semiconductor layer formed over the periodic corrugation of the compound semiconductor base using a fabrication process having a first crystal growth temperature; and a buffer layer formed so as to sandwich between the periodic corrugation and the compound semiconductor layer using a fabrication process having a second crystal growth temperature lower than the first crystal growth temperature.

Another object of the present invention is to provide a method for forming a compound semiconductor device that can avoid defects of the periodic corrugation in the compound semiconductor device.

According to another aspect of the present invention, for achieving the above object, there is provided a method for forming a compound semiconductor device comprising the steps of providing a compound semiconductor base; forming a periodic corrugation on the compound semiconductor base; forming a compound semiconductor layer over the periodic corrugation of the compound semiconductor base using a fabrication process having a first crystal growth temperature; and forming a buffer layer so as to sandwich between the periodic corrugation and the compound semiconductor layer using a fabrication process having a second crystal growth temperature lower than the first crystal growth temperature.

BRIEF DESCRIPTION OF THE DRAWINGS

While the specification includes claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A method for forming a compound semiconductor device and the compound semiconductor device according to a preferred embodiment of a present invention will hereinafter be described in detail with reference to the accompanying drawings.

Figure 1:
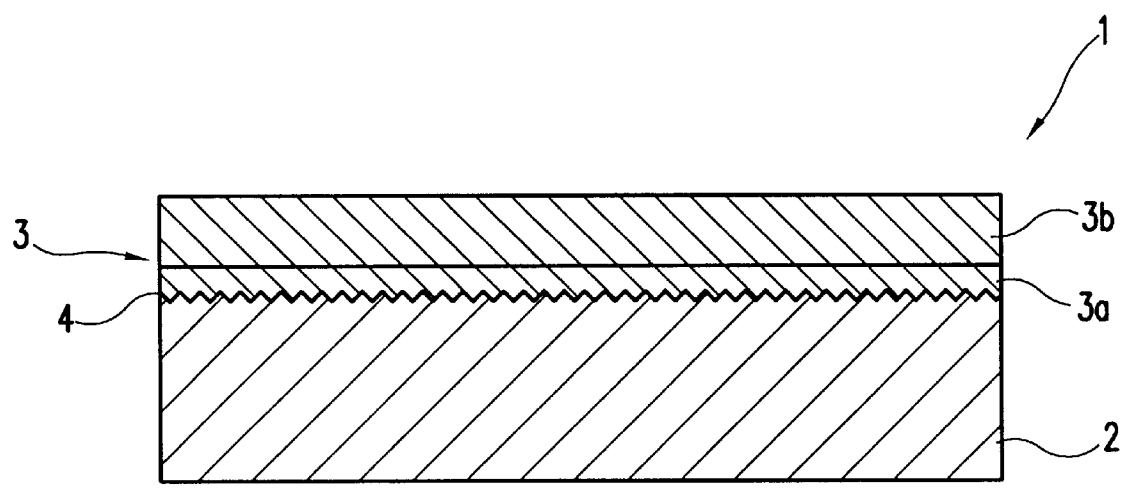
FIG. 1 is a cross-sectional view showing a compound semiconductor device according to a preferred embodiment of a present invention.

FIG. 1 is a cross-sectional view showing a compound semiconductor device according to a preferred embodiment of a present invention.

As shown in FIG. 1, a compound semiconductor device 1, for example a distributed feed back (DFB) laser includes an InP substrate 2, an InGaAsP layer as a buffer layer 3a ( an optical guide layer) and an InGaAsP as a growth layer 3b. The InP substrate 2 has a periodic corrugation 4 on a major surface. The periodic corrugation 4 is formed so as to regularly arrange at every 250 nm cycle and is formed using a well known process. The buffer layer 3a, preferably having a thickness of about 1–200 nm, is formed so as to cover the periodic corrugation 4. The growth layer 3b is formed over the periodic gating layer 4 through the buffer layer 3a. The growth region 3b serve as an active layer 3.

Figure 2:
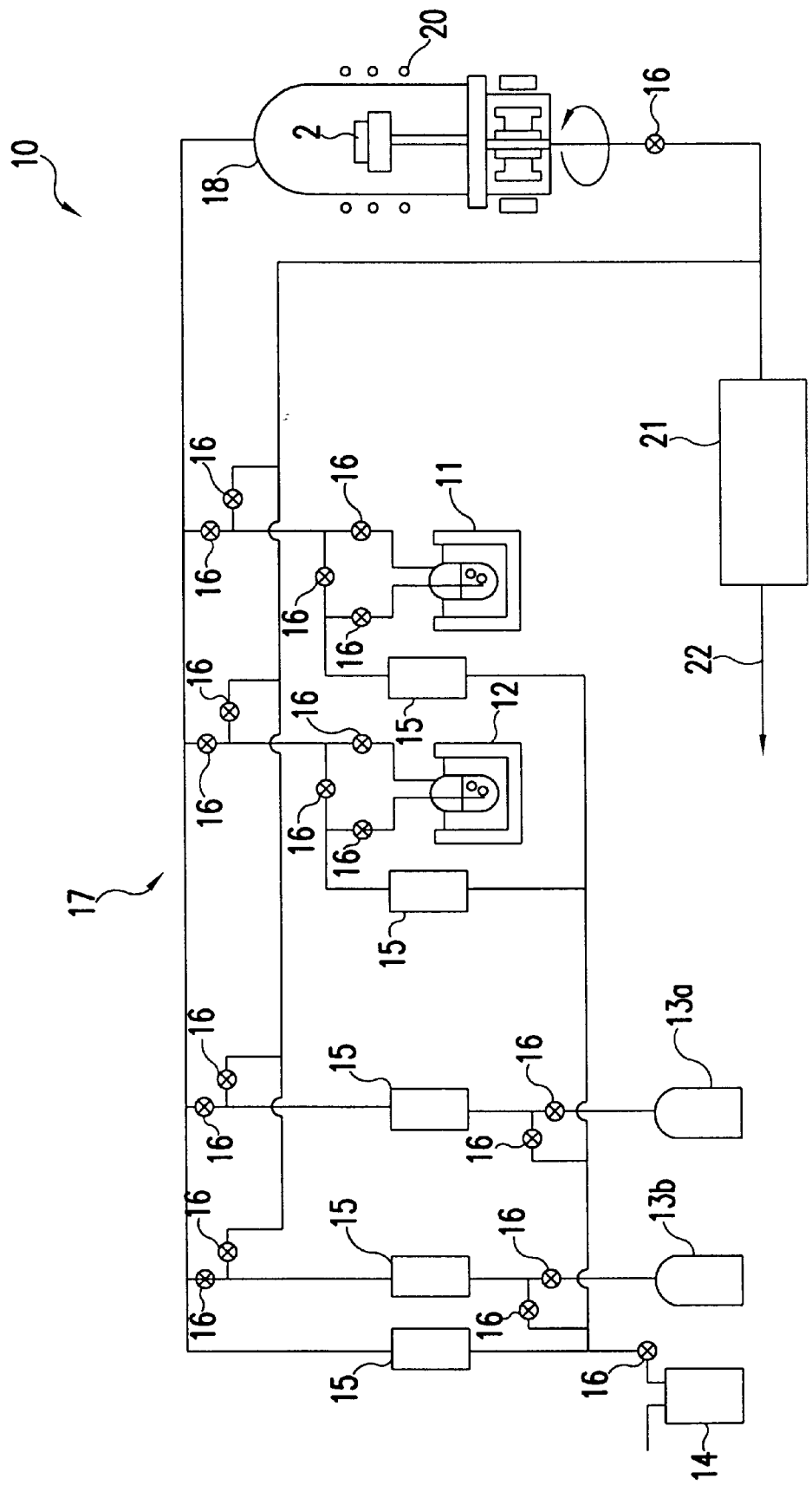
FIG. 2 is a schematic diagram showing a crystal growth apparatus for a compound semiconductor device according to a preferred embodiment of a present invention.

FIG. 2 is a schematic diagram showing a crystal growth apparatus for a compound semiconductor device according to a preferred embodiment of the present invention.

The crystal growth apparatus 10 can form InGaAsP using a metal oxide vapor phase epitaxy (MOVPE). The crystal growth apparatus 10 provides Trimethyl Indium (TMIn) source 11 and Triethyl Gallium (TEG) source 12 as an organometal material of a group III element, and Phosphine ($PH_3$) source 13a and Arsine ($AsH_3$) source 13b as source gas of a group V element. $H_2$ gas is supplied from a $H_2$ source 14 and is used as a carrier gas for the respective material gases.

The respective gases are supplied to a chamber 18 through a conduit run 17 having a plurality of mass-flow controllers 15 and a plurality of a switching bulbs 16. In the crystal growth apparatus 10, the InP substrate 2 having the corrugation 4 is placed in the chamber 18. The atmosphere temperature in the chamber 18 can be adjusted by controlling the power to a high frequency heating coil 20 used as a heating means. A exhaust line 22 of the chamber 18 provides an exhaust apparatus 21 for exhausting surplus gases.

In the crystal growth apparatus 10, $H_2$ gas used as the carrier gas is supplied from the $H_2$ gas source to the chamber 18 by operating the switching bulbs 16 before the InGaAsP layer 3a is grown.

Figure 3:
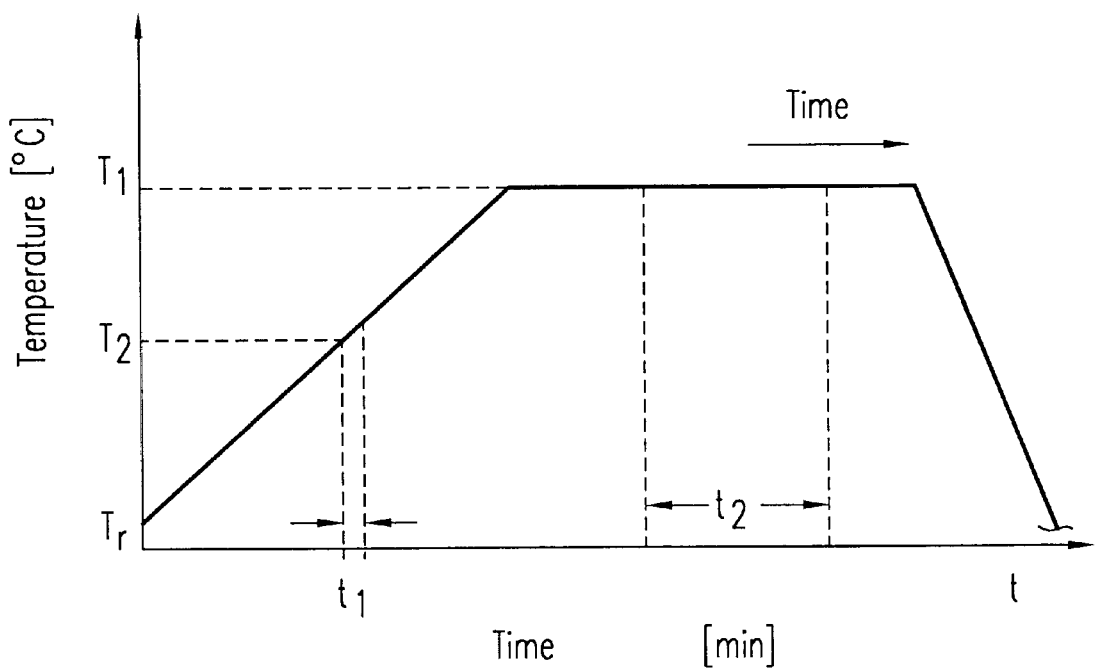
FIG. 3 is a temperature profile in a crystal growth chamber showing a method for forming a compound semiconductor device according to a preferred embodiment of a present invention.

The temperature of the chamber 18 in $H_2$ gas atmosphere is controlled based on a temperature character graph shown in FIG. 3 and by operating the high frequency heating coil 20.

FIG. 3 is a temperature profile in a crystal growth chamber for the method of forming a compound semiconductor device according to a preferred embodiment of a present invention. The abscissa axis indicates time [in minutes]. The ordinate axis indicates temperature [in ° C.].

As shown in FIG. 3, the chamber 18 heats from a room temperature Tr toward a preferred crystal growth temperature T1 of InGaAsP in the $H_2$ gas atmosphere (650° C. in the preferred embodiment).

TMIN, TEG, $PH_3$ and $AsH_3$ used as the material gases, respectively, are supplied from the TMIn source 11, the TEG source 12, the $PH_3$ source 13a and the $AsH_3$ source 13b to the chamber 18 when the temperature of the InP substrate 2 increases to about 550–570° C. lower than the preferred crystal growth temperature T1 because of heating up in the chamber 18. Here, supply ratios of respective gas sources are set so as to form a band gap wavelength of 1.15 μm and so as to grow InGaAsP matching lattice to the InP substrate 2. Specifically, a V/III ratio is preferably set to about 200–250, a growth rate is preferably set about 0.8 μm/h, a pressure in the chamber 18 is preferably set about 76 torr, and a total discharge of $H_2$ as the carrier gas supplied to the chamber 18 is preferably set about 25 slm.

The TMI, TEG, $PH_3$ and $AsH_3$ as the material gases, respectively, are supplied to the chamber 18 during the predetermined time t1 after the temperature is the predetermined temperature T2, lower than the preferred crystal growth temperature T1. As a result, In, Ga, As, and P as decomposition elements are deposited on the InP substrate 2. As a result, InGaAsP, preferably having a thickness of about 1–3 μm, is formed as a buffer layer 3a over the InP substrate 2 so as to cover the periodic corrugation 4. The supply of TMI and TEG to the chamber 18 is stopped after the buffer layer 3a grown. The temperature in the chamber 18 continually increases toward the preferred crystal growth temperature T1 after the buffer layer 3a is grown. Here, since $PH_3$ and $AsH_3$ are continually supplied to the chamber 18 during the heat up, an evaporation of phosphorus and arsenic can be avoided. As a result, a quality of the buffer layer 3a can avoid to decrease.

The TMI and TEG are supplied to the chamber 18 when a temperature in the chamber 18 reaches the crystal growth temperature T1. Here, the growth condition of InGaAsP is as follows:

A V/III ratio is preferably set to about 200–250, a growth rate is preferably set to about 0.8 μm/h, a pressure in the chamber 18 is preferably set to about 76 torr and a total discharge of $H_2$ as the carrier gas supplied to the chamber 18 is preferably set to about 25 slm.

In, Ga, As, and P are then deposited as decomposition elements on the buffer layer 3a. As a result, an InGaAs growth layer 3b having the predetermined thickness forms on the buffer layer 3a.

The temperature in the chamber 18 decreases toward room temperature after InGaAs growth layer 3b having the predetermined thickness is formed on the buffer layer 3a.

As the mentioned above, the method for forming the compound semiconductor device according to the preferred embodiment of the present invention includes the step of forming a buffer layer 3a so as to cover the periodic corrugation 4 on the InP substrate 2. In the preferred embodiment, the buffer layer 3a is formed using a crystal growth temperature lower than the preferred crystal growth temperature. As a result, the surface of the periodic corrugation 4 isn't exposed in high temperature atmosphere. Accordingly, the preferred embodiment of the present invention can avoid a shape change of the periodic corrugation 4 and a thickness change of the periodic corrugation 4 because of defect of the periodic corrugation 4.

Further, since the surface of the periodic corrugation 4 is covered by the buffer layer 3a, an evaporation of phosphorus can be avoided. Accordingly, the preferred embodiment of the present invention can avoid defect of the periodic corrugation 4 and can be avoided the mass transport because of the evaporation of phosphorus. That is, the preferred embodiment of the present invention can get superior characteristics of a compound semiconductor device, for example DFB laser.

Figure 4A:
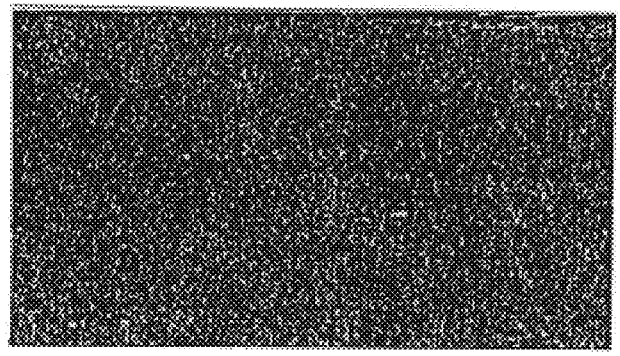
FIGS. 4A and B are photographs showing an upper surface of a crystal growth layer according to a preferred embodiment of a present invention.
Figure 4B:
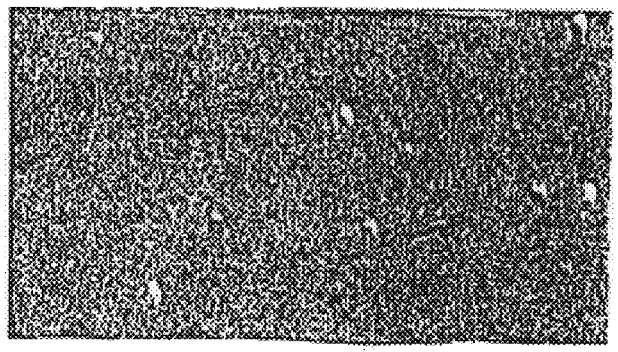
Figure 5A:
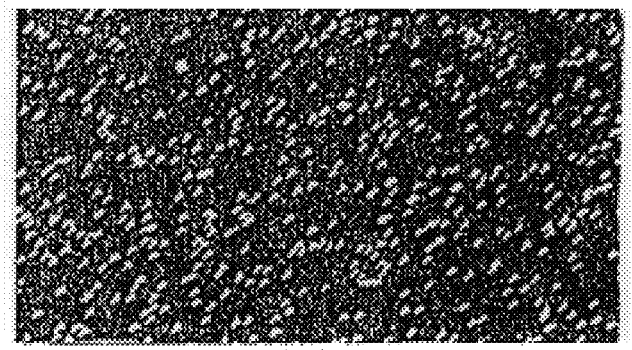
FIGS. 5A and B are photographs showing an upper surface of a crystal growth layer according to a conventional method for forming a compound semiconductor device.
Figure 5B:
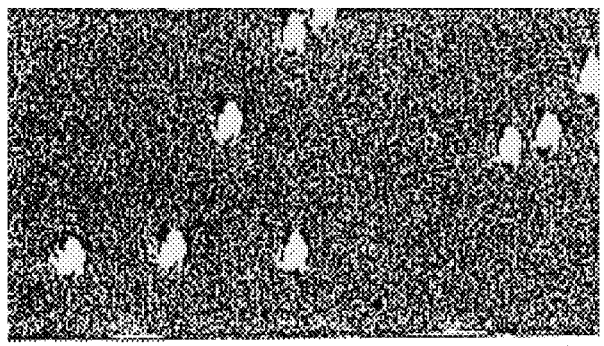

FIGS. 4A and 4B are photographs showing an upper surface of a crystal growth layer according to the preferred embodiment of the present invention. Specifically, FIGS. 4A and 4B are photographs showing a surface of InGaAsP as the growth layer formed on the InP substrate having the periodic corrugation using the InGaAsP as a buffer layer. FIGS. 5A and 5B are photographs showing a surface of InGaAsP as the growth layer formed on the InP substrate having the periodic corrugation without the use of the InGaAsP as the buffer layer.

White spots show that the periodic corrugation is rough because of the evaporation of phosphorus. As shown in FIGS. 4A and 4B, the white spots are small and sparse, thus the phosphorus isn't evaporating. But, as shown in FIGS. 5A and 5B, there are a lot of white spots, meaning that phosphorus is evaporating.

As the mentioned above, since the surface of the periodic corrugation is covered with the buffer layer, an evaporation of phosphorus can avoid.

Next, the variation of the diffraction efficiency of the compound semiconductor device of the present invention will be compared with that of the conventional compound semiconductor device. Here, the compound semiconductor device of the present invention has a surface of InGaAsP as the growth layer formed on the InP substrate having the periodic corrugation through the InGaAsP as a buffer layer. The conventional compound semiconductor device has a surface of InGaAsP as the growth layer formed on the InP substrate having the periodic corrugation without the use of the InGaAsP as a buffer layer.

The devices were respectively measured a first diffraction efficiency of the periodic corrugation 4 at a first time that the periodic corrugation 4 is formed, and were then measured a second diffraction efficiency of the periodic corrugation at the second time that the growth layers are etched so as to expose a surface of the periodic corrugation after the growth layers were etched.

The result of measuring of the first and second diffraction efficiencies is as follows:

The compound semiconductor device of the present invention:

The first diffraction efficiency: 5.1%

The second diffraction efficiency: 4.2%

The conventional compound semiconductor device:

The first diffraction efficiency: 5.0%

The second diffraction efficiency: 2.2%

Accordingly, the variation of the diffraction efficiency of the compound semiconductor device of the present invention is: (5.1%–4.2%)=0.9%

In contrast, the variation of the diffraction efficiency for the conventional compound semiconductor device is: (5.0%–2.2%)=2.8%

As shown above, the variation of the diffraction efficiency of the present invention is smaller than that of the conventional semiconductor device.

Therefore, since the surface of the periodic corrugation 4 is covered with the buffer layer, the evaporation of phosphorus can be avoided. Accordingly, the preferred embodiment of the present invention can avoid defect of the periodic corrugation 4 and can he avoided the mass transport because of the evaporation of phosphorus. That is, the preferred embodiment of the present invention can get superior characteristics for a compound semiconductor device, for example DFB laser.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method for forming a compound semiconductor device, comprising:

providing a compound semiconductor base;

forming a periodic corrugation on the compound semiconductor base;

forming a compound semiconductor layer over the periodic corrugation of the compound semiconductor base using a first fabrication process having a first crystal growth temperature; and forming a buffer layer so as to sandwich between the periodic corrugation and the compound semiconductor layer using a second fabrication process having a second crystal growth temperature lower than the first crystal growth temperature;

wherein each of the first and second fabrication processes is a metal organic vapor epitaxy process.

2. A method for forming a compound semiconductor device as claimed in claim 1, wherein the buffer layer covers the periodic corrugation so as to flat an upper surface of the compound semiconductor base.

3. A method for forming a compound semiconductor device as claimed in claim 1, wherein the compound semiconductor base is a compound semiconductor substrate.

4. A method for forming a compound semiconductor device as claimed in claim 1, wherein the compound semiconductor base and the compound semiconductor layer comprise group III and V elements.

5. A method for forming a compound semiconductor device as claimed in claim 1, wherein the compound semiconductor base comprises InP and the compound semiconductor layer and the buffer layers comprise InGaAsP.

6. A method for forming a compound semiconductor device as claimed in claim 1, further comprising:

exposing the entire device into an atmosphere of a gas including arsenide and phosphide during a heating up after the formation step of the buffer layer.

7. A method for forming a compound semiconductor device as claimed in claim 1, wherein the first crystal growth temperature is about 650° C. and the second crystal growth temperature is about 550° C. to 570° C.

8. A method for forming a compound semiconductor device as claimed in claim 1, wherein the compound semiconductor base and the compound semiconductor layer serve as an active region.

* * * * *